United States Patent
Lv et al.

(10) Patent No.: US 9,614,104 B2
(45) Date of Patent: Apr. 4, 2017

(54) CO-PLANAR OXIDE SEMICONDUCTOR TFT SUBSTRATE STRUCTURE AND MANUFACTURE METHOD THEREOF

(71) Applicant: Shenzhen China Star Optoelectronics Technology Co., Ltd., Shenzhen (CN)

(72) Inventors: Xiaowen Lv, Shenzhen (CN); Chihyuan Tseng, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/771,204

(22) PCT Filed: Jun. 18, 2015

(86) PCT No.: PCT/CN2015/081729
§ 371 (c)(1),
(2) Date: Aug. 28, 2015

(87) PCT Pub. No.: WO2016/179877
PCT Pub. Date: Nov. 17, 2016

(65) Prior Publication Data
US 2016/0351723 A1    Dec. 1, 2016

(30) Foreign Application Priority Data
May 11, 2015    (CN) .......................... 2015 1 0236460

(51) Int. Cl.
*H01L 29/786*    (2006.01)
*H01L 29/66*    (2006.01)
(Continued)

(52) U.S. Cl.
CPC ...... *H01L 29/78696* (2013.01); *H01L 27/124* (2013.01); *H01L 27/1248* (2013.01);
(Continued)

(58) Field of Classification Search
CPC ......... H01L 29/41733; H01L 29/66969; H01L 29/78696; H01L 27/124; H01L 27/1248
See application file for complete search history.

(56) References Cited

U.S. PATENT DOCUMENTS

| | | | |
|---|---|---|---|
| 9,418,842 B2* | 8/2016 | Nakamura | .......... H01L 29/7869 |
| 2016/0027904 A1* | 1/2016 | Lv | ...................... H01L 29/7869 438/104 |

* cited by examiner

*Primary Examiner* — Cuong Q Nguyen
(74) *Attorney, Agent, or Firm* — Leong C. Lei

(57) ABSTRACT

The present invention provides a co-planar oxide semiconductor TFT substrate structure and a manufacture method thereof. In the co-planar oxide semiconductor TFT substrate structure, the active layer comprises a main body and a plurality of short channels connected to the main body, and the plurality of short channels are separated with the plurality of strip metal electrodes to make the active layer possess higher mobility and lower leak current. Thus, the performance of the TFT element can be improved. The present invention provides a manufacture method of a co-planar oxide semiconductor TFT substrate structure. With forming the plurality of strip metal electrodes between the source and the drain, which are separately positioned, as deposing the oxide semiconductor layer, the plurality of short channels can be formed between the source and the drain. The method is simple and does not require additional mask or process to obtain the active layer structure different from prior art. The manufactured actively layer possesses higher mobility and lower leak current. Thus, the performance of the TFT element can be improved.

5 Claims, 6 Drawing Sheets

(51) Int. Cl.
*H01L 27/12* (2006.01)
*H01L 29/417* (2006.01)

(52) U.S. Cl.
CPC .. *H01L 29/41733* (2013.01); *H01L 29/66969* (2013.01); *H01L 29/7869* (2013.01); *H01L 29/78609* (2013.01)

CO-PLANAR OXIDE SEMICONDUCTOR TFT SUBSTRATE STRUCTURE AND MANUFACTURE METHOD THEREOF

FIELD OF THE INVENTION

The present invention relates to a flat panel display field, and more particularly to a co-planar oxide semiconductor TFT substrate structure and manufacture method thereof.

BACKGROUND OF THE INVENTION

The active matrix panel display elements possess many merits of thin frame, power saving, no radiation, etc. and have been widely used. The Organic Light Emitting Diode (OLED) display technology is a flat panel display technology which has great prospects for development. It possesses extremely excellent display performance, and particularly the properties of self-illumination, simple structure, ultra thin, fast response speed, wide view angle, low power consumption and capability of realizing flexible display, and therefore is considered as the "dream display". Meanwhile, the investment for the production equipments is far smaller than the TFT-LCD (Thin Film Transistor-Liquid Crystal Display). It has been favored by respective big display makers and has become the main selection of the third generation display element of the display technology field. At present, the OLED has reached the point before mass production. With the further research and development, the new technologies constantly appear, and someday, there will be a breakthrough for the development of the OLED display elements.

The Oxide Semiconductor possesses higher electron mobility and non crystalline structure, and has higher compatibility with the amorphous silicon process. Therefore, the Oxide Semiconductor has been widely utilized in the skill field of large scale Organic Light Emitting Display.

At present, the common structure of the oxide semiconductor TFT substrate is the ESL (Etching Stop Layer) structure. However, the structure itself has some problems. For example, the uniformity of the etching is difficult to control, and the additional mask and photolithographic process are required, and the gate overlaps with the source/the drain, and the storage capacitor is larger, and it is difficult to reach high resolution.

In comparison with the Etching Stop Layer structure, the Coplanar oxide semiconductor TFT substrate structure is more reasonable and has the production prospect which is more possible. As shown from FIG. 1 to FIG. 5, disclosed is a manufacture method of a co-planar oxide semiconductor TFT substrate structure according to prior art, comprising steps of:

step 1, providing a substrate 100, and deposing a first metal layer on the substrate 100, and patterning the first metal layer with a photolithographic process to form a first gate 210 and a second gate 220 which are separately positioned;

step 2, deposing a gate isolation layer 300 on the first gate 210, the second gate 220 and the substrate 100, and patterning the same with a photolithographic process to form a first via 310 in the gate isolation layer 300 correspondingly above the second gate 220;

step 3, deposing a second metal layer on the gate isolation layer 300, and patterning the second metal layer with a photolithographic process to form a source 410, a drain 420, which are separately positioned, and forming a second via 425 on the drain 420;

Specifically, the drain 420 is connected with the second gate 220 through the first via 310.

step 4, deposing an oxide semiconductor layer on the source 410, the drain 420 and the gate isolation layer 300, and patterning the same with a photolithographic process to form an active layer 500, and the active layer 500 comprises a main body 520 and a channel 510 connected to the main body 520 between the source 410 and the drain 420;

step 5, deposing a passivation layer 600 on the active layer 500, the source 410 and the drain 420, and patterning the same with a photolithographic process to form a third via 610 in the passivation layer 600 correspondingly above the drain 420.

Specifically, the passivation layer 600 fills in the second via 425 on the drain 420.

In the co-planar oxide semiconductor TFT substrate structure manufactured by the aforesaid method, the channel 510 of the active layer 500 is a long channel. The active layer 500 possesses lower mobility and higher leak current. The performance of the TFT element is worse.

SUMMARY OF THE INVENTION

An objective of the present invention is to provide a co-planar oxide semiconductor TFT substrate structure. The active layer comprises a main body and a plurality of short channels connected to the main body between the source and the drain, and the plurality of short channels are separated with the plurality of strip metal electrodes to make the active layer possess higher mobility and lower leak current. Thus, the performance of the TFT element can be improved.

Another objective of the present invention is to provide a manufacture method of a co-planar oxide semiconductor TFT substrate structure. With one photolithographic process, the source, the drain and the plurality of strip metal electrodes between the source and the drain, which are separately positioned are formed, and as deposing the oxide semiconductor layer in the next process, the plurality of short channels can be formed between the source and the drain, and the plurality of short channels can separate the plurality of strip metal electrodes. The method is simple and does not require usage of additional mask or process to obtain the active layer structure different from prior art. The manufactured actively layer possesses higher mobility and lower leak current. Thus, the performance of the TFT element can be improved.

For realizing the aforesaid objectives, the present invention provides a co-planar oxide semiconductor TFT substrate structure, comprising a substrate, a first gate and a second gate on the substrate, a gate isolation layer on the first gate, the second gate and the substrate, a source, a drain on the gate isolation layer, a plurality of strip metal electrodes between the source and the drain, which are separately positioned, an active layer on the source, the drain, the strip metal electrodes and the gate isolation layer, a passivation layer on the active layer, the source and the drain;

wherein the active layer comprises a main body and a plurality of short channels connected to the main body between the source and the drain, and the plurality of short channels are separated with the plurality of strip metal electrodes.

The gate isolation layer is provided with a first via correspondingly above the second gate, and the drain is connected with the second gate through the first via.

The drain is provided with a second via, and the passivation layer fills in the second via; the passivation layer is provided with a third via correspondingly above the drain.

Material of the active layer is metal oxide; material of the first gate and the second gate is copper, aluminum or molybdenum; material of the gate isolation layer is silicon oxide or silicon nitride.

Material of the source, the drain and the strip metal electrodes is copper, aluminum or molybdenum, and material of the passivation layer is silicon oxide or silicon nitride.

The present invention further provides a manufacture method of a co-planar oxide semiconductor TFT substrate structure, comprising steps of:

step 1, providing a substrate, and deposing a first metal layer on the substrate, and patterning the first metal layer with a photolithographic process to form a first gate and a second gate which are separately positioned;

step 2, deposing a gate isolation layer on the first gate, the second gate and the substrate, and patterning the same with a photolithographic process to form a first via in the gate isolation layer correspondingly above the second gate;

step 3, deposing a second metal layer on the gate isolation layer, and patterning the second metal layer with a photolithographic process to form a source, a drain and a plurality of strip metal electrodes between the source and the drain, which are separately positioned;

the drain is connected with the second gate through the first via;

a second via is formed on the drain;

step 4, deposing an oxide semiconductor layer on the source, the drain, the strip metal electrodes and the gate isolation layer, and patterning the same with a photolithographic process to form an active layer, and the active layer comprises a main body and a plurality of short channels connected to the main body between the source and the drain, and the plurality of short channels are separated with the plurality of strip metal electrodes;

step 5, deposing a passivation layer on the active layer, the source and the drain, and patterning the same with a photolithographic process to form a third via in the passivation layer correspondingly above the drain;

the passivation layer fills in the second via on the drain.

Material of the active layer is metal oxide.

Material of the first gate and the second gate is copper, aluminum or molybdenum; material of the gate isolation layer is silicon oxide or silicon nitride.

Material of the source, the drain and the strip metal electrodes is copper, aluminum or molybdenum.

Material of the passivation layer is silicon oxide or silicon nitride.

The present invention further provides a manufacture method of a co-planar oxide semiconductor TFT substrate structure, comprising steps of:

step 1, providing a substrate, and deposing a first metal layer on the substrate, and patterning the first metal layer with a photolithographic process to form a first gate and a second gate which are separately positioned;

step 2, deposing a gate isolation layer on the first gate, the second gate and the substrate, and patterning the same with a photolithographic process to form a first via in the gate isolation layer correspondingly above the second gate;

step 3, deposing a second metal layer on the gate isolation layer, and patterning the second metal layer with a photolithographic process to form a source, a drain and a plurality of strip metal electrodes between the source and the drain, which are separately positioned;

the drain is connected with the second gate through the first via;

a second via is formed on the drain;

step 4, deposing an oxide semiconductor layer on the source, the drain, the strip metal electrodes and the gate isolation layer, and patterning the same with a photolithographic process to form an active layer, and the active layer comprises a main body and a plurality of short channels connected to the main body between the source and the drain, and the plurality of short channels are separated with the plurality of strip metal electrodes;

step 5, deposing a passivation layer on the active layer, the source and the drain, and patterning the same with a photolithographic process to form a third via in the passivation layer correspondingly above the drain;

the passivation layer fills in the second via on the drain;

wherein material of the active layer is metal oxide;

wherein material of the first gate and the second gate is copper, aluminum or molybdenum; material of the gate isolation layer is silicon oxide or silicon nitride;

wherein material of the source, the drain and the strip metal electrodes is copper, aluminum or molybdenum;

wherein material of the passivation layer is silicon oxide or silicon nitride.

The benefits of the present invention are: the present invention provides a co-planar oxide semiconductor TFT substrate structure and a manufacture method thereof. In the co-planar oxide semiconductor TFT substrate structure, the active layer comprises a main body and a plurality of short channels connected to the main body, and the plurality of short channels are separated with the plurality of strip metal electrodes to make the active layer possess higher mobility and lower leak current. Thus, the performance of the TFT element can be improved. The present invention provides a manufacture method of a co-planar oxide semiconductor TFT substrate structure. With one photolithographic process, the source, the drain and the plurality of strip metal electrodes between the source and the drain, which are separately positioned are formed, and as deposing the oxide semiconductor layer in the next process, the plurality of short channels can be formed between the source and the drain, and the plurality of short channels can separate the plurality of strip metal electrodes. The method is simple and does not require usage of additional mask or process to obtain the active layer structure different from prior art. The manufactured actively layer possesses higher mobility and lower leak current. Thus, the performance of the TFT element can be improved.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
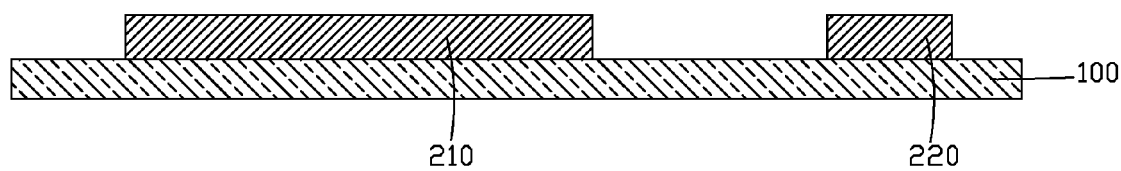
FIG. 1 is a diagram of step 1 in a manufacture method of a co-planar oxide semiconductor TFT substrate structure according to prior art.
Figure 2:
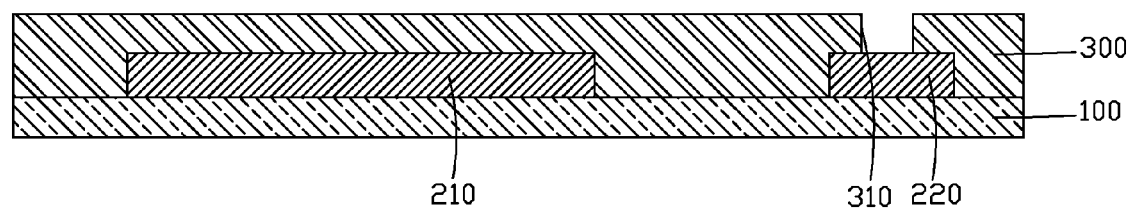
FIG. 2 is a diagram of step 2 in a manufacture method of a co-planar oxide semiconductor TFT substrate structure according to prior art.
Figure 3:
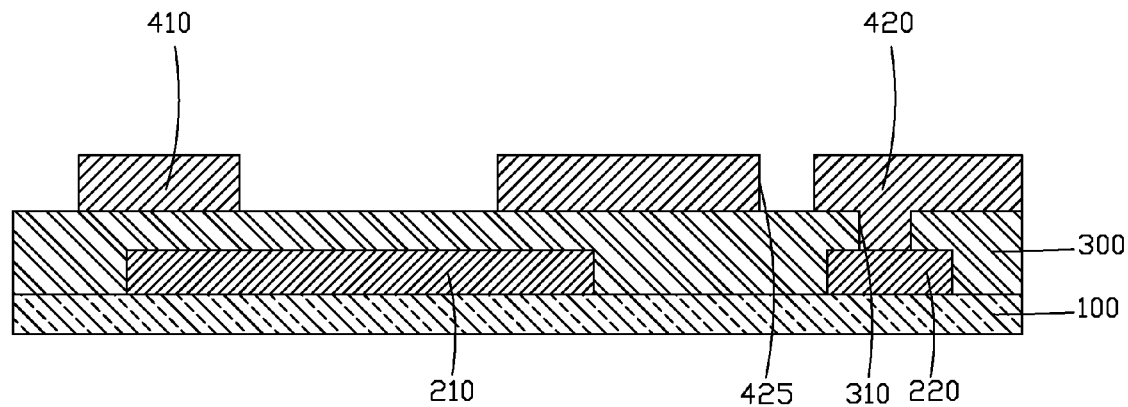
FIG. 3 is a diagram of step 3 in a manufacture method of a co-planar oxide semiconductor TFT substrate structure according to prior art.
Figure 4:
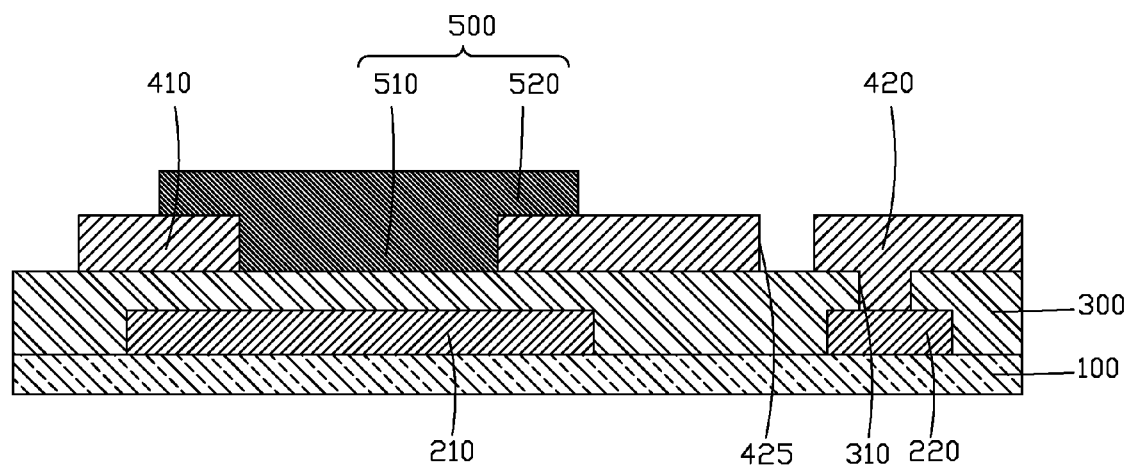
FIG. 4 is a diagram of step 4 in a manufacture method of a co-planar oxide semiconductor TFT substrate structure according to prior art.

Please refer to FIG. 1. The present invention first provides a co-planar oxide semiconductor TFT substrate structure, comprising a substrate 10, a first gate 21 and a second gate 22 on the substrate 10, a gate isolation layer 30 on the first gate 21, the second gate 22 and the substrate 10, a source 41, a drain 42 on the gate isolation layer 30, a plurality of strip metal electrodes 43 between the source 41 and the drain 42, which are separately positioned, an active layer 50 on the source 41, the drain 42, the strip metal electrodes 43 and the gate isolation layer 30, a passivation layer 60 on the active layer 50, the source 41 and the drain 42;

wherein the active layer 50 comprises a main body 51 and a plurality of short channels 52 connected to the main body 51 between the source 41 and the drain 42, and the plurality of short channels 52 are separated with the plurality of strip metal electrodes 43.

Specifically, the gate isolation layer 30 is provided with a first via 31 correspondingly above the second gate 22, and the drain 42 is connected with the second gate 22 through the first via 31.

The drain 42 is provided with a second via 421, and the passivation layer 60 fills in the second via 421.

The passivation layer 60 is provided with a third via 61 correspondingly above the drain 42.

Preferably, material of the first gate 21 and the second gate 22 is copper, aluminum or molybdenum.

Material of the gate isolation layer 30 is silicon oxide or silicon nitride.

Material of the source 41, the drain 42 and the strip metal electrodes 43 is copper, aluminum or molybdenum.

Specifically, material of the active layer 50 is metal oxide, and preferably, the metal oxide is Indium Gallium Zinc Oxide (IGZO).

Preferably, material of the passivation layer 60 is silicon oxide or silicon nitride.

Figure 5:
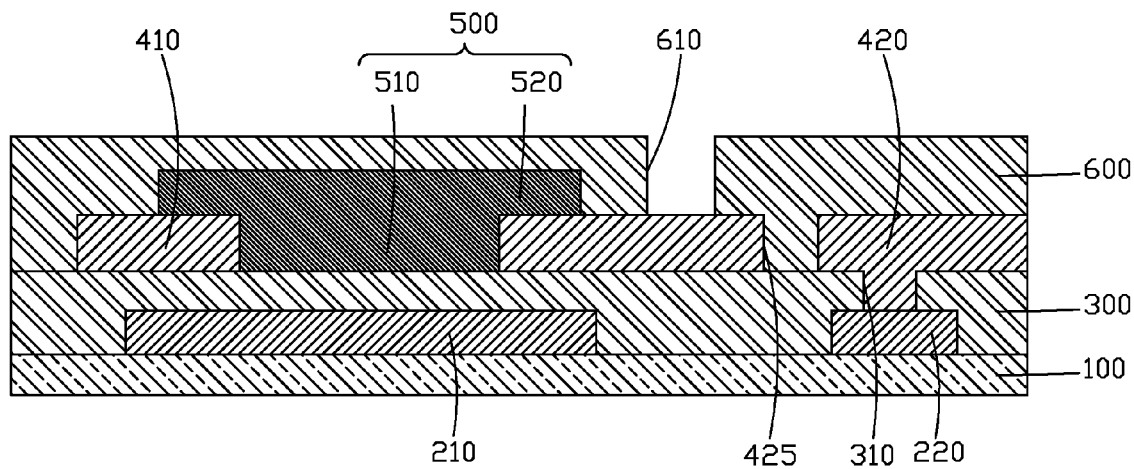
FIG. 5 is a diagram of step 5 in a manufacture method of a co-planar oxide semiconductor TFT substrate structure according to prior art.
Figure 6:
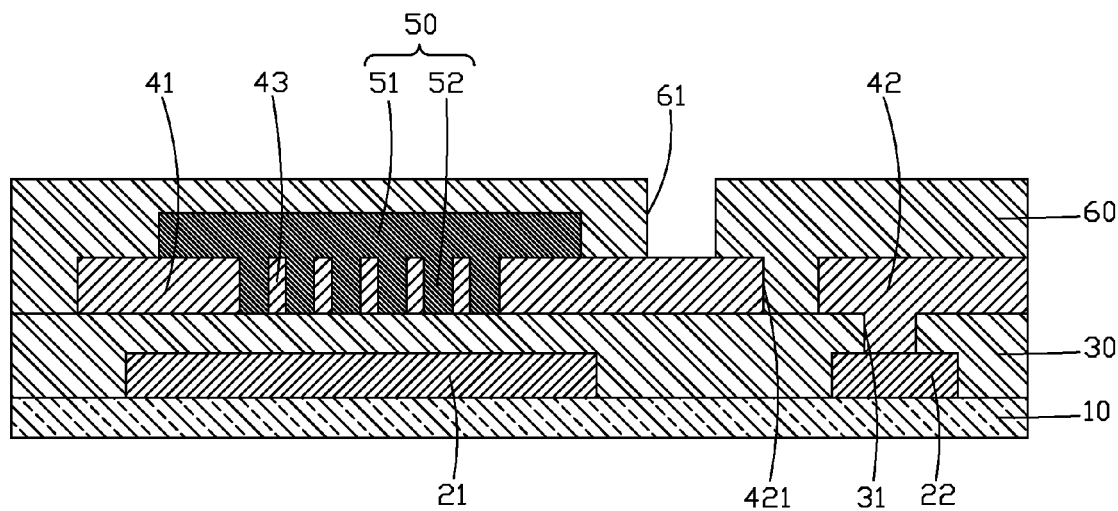
FIG. 6 is a sectional diagram of a co-planar oxide semiconductor TFT substrate structure according to the present invention.
Figure 7:
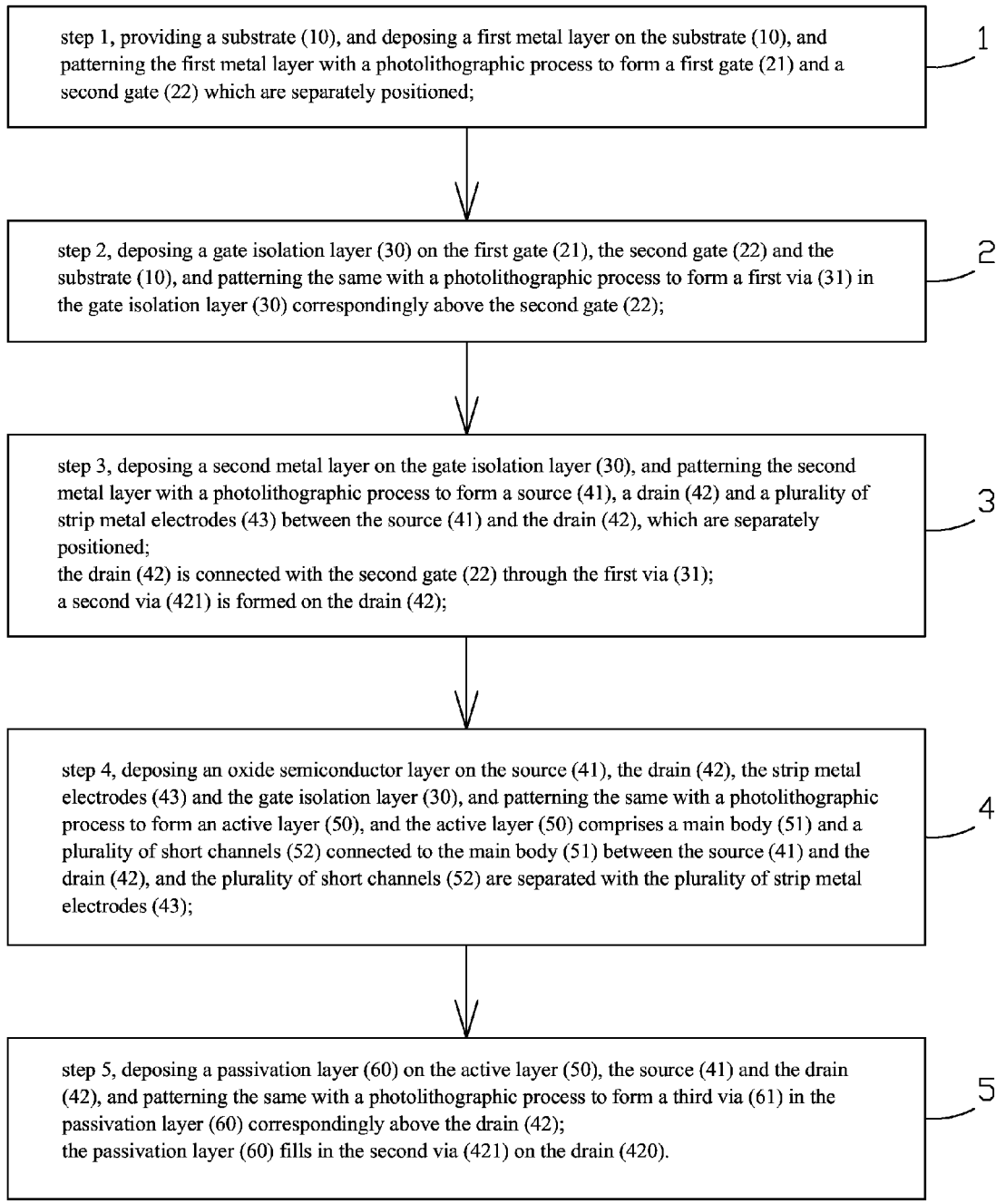
FIG. 7 is a flowchart of a manufacture method of a co-planar oxide semiconductor TFT substrate structure according to the present invention.

The present invention provides a co-planar oxide semiconductor TFT substrate structure. The channel of the active layer 50 is composed by a plurality of short channels 52, which are separately positioned. In comparison with prior art, it is equivalent to that the original long channel 510 (as shown in FIG. 5) is divided into several short channels 52, which are separately positioned. According to the short channel effect of the element, by changing the width and dimension of the short channel 52, the performance parameters, such as the gate voltage ($V_{th}$), the switch speed (S.S.), the working current ($I_{on}$) and leakage current ($I_{off}$) of the TFT element can be regulated to improve the performance of the TFT element without adding photo or other processes.

Figure 8:
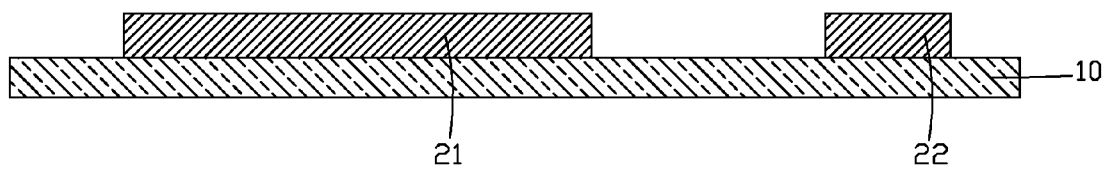
FIG. 8 is a diagram of step 1 in a manufacture method of a co-planar oxide semiconductor TFT substrate structure according to the present invention.

Please refer from FIG. 6 to FIG. 11. The present invention further provides a manufacture method of a co-planar oxide semiconductor TFT substrate structure, comprising steps of:

step 1, as shown in FIG. 8, providing a substrate 10, and deposing a first metal layer on the substrate 10, and patterning the first metal layer with a photolithographic process to form a first gate 21 and a second gate 22 which are separately positioned.

Figure 9:
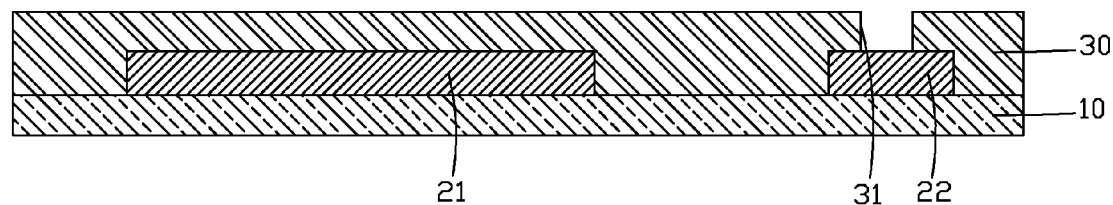
FIG. 9 is a diagram of step 2 in a manufacture method of a co-planar oxide semiconductor TFT substrate structure according to the present invention.

Preferably, material of the first gate 21 and the second gate 22 is copper, aluminum or molybdenum.

step 2, as shown in FIG. 9, deposing a gate isolation layer 30 on the first gate 21, the second gate 22 and the substrate 10, and patterning the same with a photolithographic process to form a first via 31 in the gate isolation layer 30 correspondingly above the second gate 22.

Figure 10:
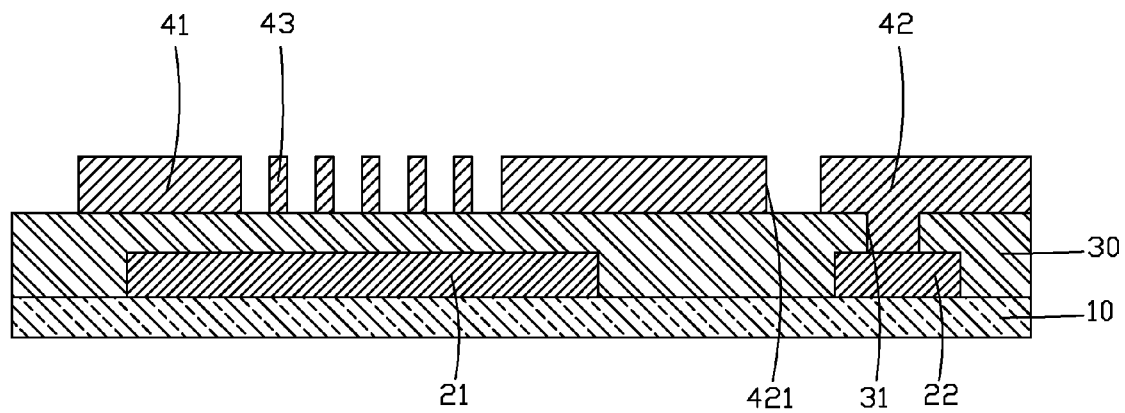
FIG. 10 is a diagram of step 3 in a manufacture method of a co-planar oxide semiconductor TFT substrate structure according to the present invention.

Preferably, material of the gate isolation layer 30 is silicon oxide or silicon nitride.

step 3, as shown in FIG. 10, deposing a second metal layer on the gate isolation layer 30, and patterning the second metal layer with a photolithographic process to form a source 41, a drain 42 and a plurality of strip metal electrodes 43 between the source 41 and the drain 42, which are separately positioned.

Specifically, the drain 42 is connected with the second gate 22 through the first via 31.

Specifically, a second via 421 is formed on the drain 42.

Specifically, the source 41, the drain 42 and the strip metal electrodes 43 are formed with one photolithographic process.

Figure 11:
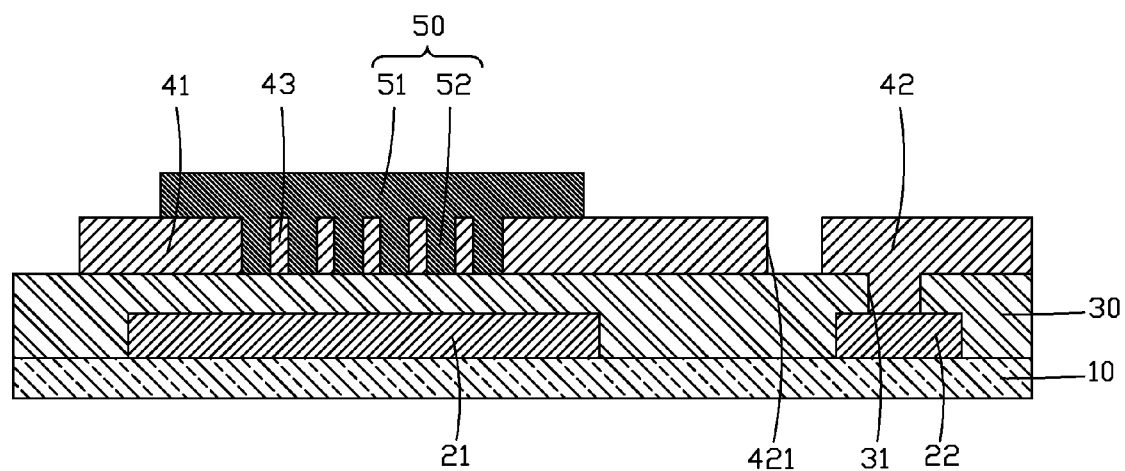
FIG. 11 is a diagram of step 4 in a manufacture method of a co-planar oxide semiconductor TFT substrate structure according to the present invention.

Preferably, material of the source 41, the drain 42 and the strip metal electrodes 43 is copper, aluminum or molybdenum.

step 4, as shown in FIG. 11, deposing an oxide semiconductor layer on the source 41, the drain 42, the strip metal electrodes 43 and the gate isolation layer 30, and patterning the same with a photolithographic process to form an active layer 50, and the active layer 50 comprises a main body 51 and a plurality of short channels 52 connected to the main body 51 between the source 41 and the drain 42, and the plurality of short channels 52 are separated with the plurality of strip metal electrodes 43.

Specifically, material of the active layer 50 is metal oxide, and preferably, the metal oxide is Indium Gallium Zinc Oxide (IGZO).

With one photolithographic process of step 3 of the present invention, the source 41, the drain 42 and the plurality of strip metal electrodes 43 between the source 41 and the drain 42, which are separately positioned are formed, and as deposing the oxide semiconductor layer in step 4, the plurality of short channels 52 can be formed between the source 41 and the drain 42, and the plurality of short channels 52 can separate the plurality of strip metal electrodes 43. The method is simple and does not require additional mask or process to obtain the active layer structure different from prior art. The manufactured actively layer 50 possesses higher mobility and lower leak current. Thus, the performance of the TFT element can be improved.

step 5, deposing a passivation layer 60 on the active layer 50, the source 41 and the drain 42, and patterning the same with a photolithographic process to form a third via 61 in the passivation layer 60 correspondingly above the drain 42. Accordingly, the co-planar oxide semiconductor TFT substrate structure shown in FIG. 6 can be obtained.

Specifically, the passivation layer 60 fills in the second via 421 on the drain 42.

Preferably, material of the passivation layer 60 is silicon oxide or silicon nitride.

The present invention provides a manufacture method of a co-planar oxide semiconductor TFT substrate structure. With one photolithographic process, the source, the drain and the plurality of strip metal electrodes between the source and the drain, which are separately positioned are formed, and as deposing the oxide semiconductor layer in the next process, the plurality of short channels can be formed between the source and the drain, and the plurality of short channels can separate the plurality of strip metal electrodes. The method is simple and does not require additional mask or process to obtain the active layer structure different from prior art. The manufactured actively layer possesses higher mobility and lower leak current. Thus, the performance of the TFT element can be improved.

In conclusion, in a co-planar oxide semiconductor TFT substrate structure provided by the present invention, the active layer comprises a main body and a plurality of short channels connected to the main body between the source and the drain, and the plurality of short channels are separated with the plurality of strip metal electrodes to make the active layer possess higher mobility and lower leak current. Thus, the performance of the TFT element can be improved. The present invention provides a manufacture method of a co-planar oxide semiconductor TFT substrate structure. With one photolithographic process, the source, the drain and the plurality of strip metal electrodes between the source and the drain, which are separately positioned are formed, and as deposing the oxide semiconductor layer in the next process, the plurality of short channels can be formed between the source and the drain, and the plurality of short channels can separate the plurality of strip metal electrodes. The method is simple and does not require usage of additional mask or process to obtain the active layer structure different from prior art. The manufactured actively layer possesses higher mobility and lower leak current. Thus, the performance of the TFT element can be improved.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A co-planar oxide semiconductor TFT substrate structure, comprising a substrate, a first gate and a second gate on the substrate, a gate isolation layer on the first gate, the second gate and the substrate, a source, a drain on the gate isolation layer, a plurality of strip metal electrodes between the source and the drain, which are separately positioned, an active layer on the source, the drain, the strip metal electrodes and the gate isolation layer, a passivation layer on the active layer, the source and the drain;

wherein the active layer comprises a main body and a plurality of short channels connected to the main body between the source and the drain, and the plurality of short channels are separated with the plurality of strip metal electrodes.

2. The co-planar oxide semiconductor TFT substrate structure according to claim 1, wherein the gate isolation layer is provided with a first via correspondingly above the second gate, and the drain is connected with the second gate through the first via.

3. The co-planar oxide semiconductor TFT substrate structure according to claim 1, wherein the drain is provided with a second via, and the passivation layer fills in the second via; the passivation layer is provided with a third via correspondingly above the drain.

4. The co-planar oxide semiconductor TFT substrate structure according to claim 1, wherein material of the active layer is metal oxide; material of the first gate and the second gate is copper, aluminum or molybdenum; material of the gate isolation layer is silicon oxide or silicon nitride.

5. The co-planar oxide semiconductor TFT substrate structure according to claim 1, wherein material of the source, the drain and the strip metal electrodes is copper, aluminum or molybdenum, and material of the passivation layer is silicon oxide or silicon nitride.

\* \* \* \* \*